(12) United States Patent
Takahashi (10) Patent No.: US 6,867,931 B2
(45) Date of Patent: *Mar. 15, 2005

(54) DUAL-IMAGING OPTICAL SYSTEM

(75) Inventor: Tomowaki Takahashi, Tokohama (JP)

(73) Assignee: Nikon Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/086,472

(22) Filed: Feb. 28, 2002

(65) Prior Publication Data

US 2002/0163733 A1 Nov. 7, 2002

Related U.S. Application Data

(63) Continuation of application No. 09/679,268, filed on Oct. 4, 2000, now Pat. No. 6,454,385, which is a continuation of application No. 08/877,920, filed on Jun. 18, 1997, now Pat. No. 6,157,498.

(30) Foreign Application Priority Data

Jun. 19, 1996 (JP) .............................................. 8-179881
Jun. 19, 1996 (JP) .............................................. 8-179882

(51) Int. Cl.[7] .............................................. G02B 17/00
(52) U.S. Cl. ..................... 359/728; 359/366; 359/708; 359/727
(58) Field of Search .............................. 359/362–366, 359/708, 726–732, 355–361, 857–863; 355/52–64, 47

(56) References Cited

U.S. PATENT DOCUMENTS

| | | | | |
|---|---|---|---|---|
| 3,811,749 A | * | 5/1974 | Abel | 359/365 |
| 4,240,702 A | | 12/1980 | Casas | 359/651 |
| 4,293,186 A | | 10/1981 | Offner | 359/366 |
| 4,293,196 A | | 10/1981 | Hilbert | 359/651 |
| 4,331,390 A | | 5/1982 | Shafer | 359/727 |
| 4,342,503 A | * | 8/1982 | Shafer | 359/729 |
| 4,367,010 A | | 1/1983 | Broome | 359/708 |
| 4,469,414 A | | 9/1984 | Shafer | 359/365 |
| 4,477,156 A | | 10/1984 | Gebelein et al. | 359/399 |
| 4,523,816 A | | 6/1985 | Kreitzer | 359/642 |
| 4,685,777 A | | 8/1987 | Hirose | 359/366 |
| 4,714,307 A | * | 12/1987 | Palmer | 359/356 |
| 4,737,021 A | * | 4/1988 | Korsch | 359/366 |
| 4,779,966 A | | 10/1988 | Friedman | 359/728 |
| 4,861,148 A | | 8/1989 | Sato et al. | 359/365 |
| 4,906,078 A | | 3/1990 | Inabata et al. | 359/708 |
| 4,971,428 A | | 11/1990 | Moskovich | 359/366 |
| 5,004,331 A | | 4/1991 | Haseltine et al. | 359/727 |
| 5,031,976 A | | 7/1991 | Shafer | 359/355 |
| 5,052,763 A | | 10/1991 | Singh et al. | 359/355 |
| 5,063,586 A | | 11/1991 | Jewell et al. | 328/34 |
| 5,148,314 A | | 9/1992 | Chen | 359/642 |
| 5,153,772 A | | 10/1992 | Kathman et al. | 359/365 |
| 5,212,593 A | | 5/1993 | Williamson et al. | 359/728 |
| 5,287,218 A | | 2/1994 | Chen | 359/365 |
| 5,323,263 A | | 6/1994 | Schoemakers | 359/365 |
| 5,392,119 A | | 2/1995 | McArthur et al. | 356/355 |
| 5,402,267 A | | 3/1995 | Fürter et al. | 359/727 |
| 5,539,260 A | | 7/1996 | Khangura et al. | 302/10.3 |

(List continued on next page.)

Primary Examiner—Thong Q Nguyen
(74) Attorney, Agent, or Firm—Klarquist Sparkman, LLP (57) ABSTRACT

An optical imaging system especially for microlithography includes a first imaging system forming an intermediate image of an object, and a second imaging system forming, on a surface, an image of the intermediate image. A reflective surface directs light from the first imaging system to the second imaging system. An aspherical corrective optical surface is located at or near the location of the intermediate image for correcting aberrations such as high-order distortion, aberrations due to accumulation of manufacturing tolerances, and spherical aberration. The first imaging system comprises a positive power refractive element and a concave mirror. The second imaging system comprises refractive elements and no concave mirror.

36 Claims, 7 Drawing Sheets

U.S. PATENT DOCUMENTS

| | | | |
|---|---|---|---|
| 5,636,066 A | 6/1997 | Takahashi | 359/726 |
| 5,650,877 A | 7/1997 | Phillips, Jr. et al. | 359/732 |
| 5,668,673 A | 9/1997 | Suenaga et al. | 359/727 |
| 5,689,377 A | 11/1997 | Takahashi | 359/727 |
| 5,691,802 A | 11/1997 | Takahashi | 359/727 |
| 5,694,241 A | 12/1997 | Ishiyama et al. | 359/364 |
| 5,805,334 A | 9/1998 | Takahashi | 359/784 |
| 5,808,805 A | 9/1998 | Takahashi | 359/651 |
| 5,815,310 A | 9/1998 | Williamson | 359/365 |
| 5,861,997 A | 1/1999 | Takahashi | 359/727 |
| 5,880,891 A | 3/1999 | Fürter | 359/651 |
| 5,995,280 A | 11/1999 | Beach | 359/366 |
| 5,999,333 A | 12/1999 | Takahashi | 359/726 |
| 6,229,595 B1 | 5/2001 | McKinley et al. | 355/53 |
| 2002/0039175 A1 | 4/2002 | Shafer et al. | 353/69 |

\* cited by examiner

DUAL-IMAGING OPTICAL SYSTEM

RELATED APPLICATIONS

This is a continuation of application Ser. No. 09/679,268, filed Oct. 4, 2000 now U.S. Pat. No. 6,454,385 which is a continuation of application Ser. No. 08/877,920, filed Jun. 18, 1997, U.S. Pat. No. 6,157,498

FIELD OF THE INVENTION

This invention pertains primarily to optical systems used in reduction-type projection-exposure apparatus such as projection steppers and scanners used in the manufacture of semiconductors. The invention is especially directed to such apparatus that employ catadioptric optical systems in their optical systems with resolution in the sub-micron levels of the ultraviolet wavelengths.

BACKGROUND OF THE INVENTION

As circuit patterns for semiconductors become finer, higher levels of resolution are demanded of steppers and scanners that expose these patterns. To satisfy demands for higher resolution, the wavelength of the radiation employed must be reduced, and the numerical aperture (NA) of the optical system must be increased.

Only a few optical materials are adequately transmissive at shorter wavelengths. For wavelengths of 300 nm or less, the only currently available materials that can be used effectively are synthetic fused silica and fluorite.

The Abbe numbers of fused silica and fluorite are not sufficiently different from each other to allow complete correction of chromatic aberration. For this reason, at wavelengths of 300 nm or below, it is extremely difficult to correct chromatic aberration in projection-optical systems comprised solely of standard refractive optical systems.

Fluorite itself suffers from certain disadvantages. The refractive index of fluorite changes relatively rapidly with variations in temperature, and fluorite polishes poorly. Thus, many optical systems do not use fluorite, resulting in systems with lenses of fused silica only. Such all-silica systems exhibit uncorrectable chromatic aberration.

Purely reflective optical systems avoid chromatic aberration, but such systems tend to be excessively large, and to require one or more aspheric reflecting surfaces. The production of (large) precision aspheric surfaces is extremely difficult.

As a result, various technologies making use of "catadioptric" optical systems (i.e., optical systems in which refractive elements are combined with reflective elements) have been proposed for reduction projection-optical systems. Among these have been several that propose the formation of an intermediate image one or more times within the optical system.

Previously proposed reduction projection-optical systems which form only one intermediate image are disclosed in Japanese laid-open patent documents 5-25170 (1993), 63-163319 (1988), 4-234722 (1992), and in U.S. Pat. No. 4,779,966. Among these proposed systems, only those disclosed in Japanese laid-open patent document 4-234722 and U.S. Pat. No. 4,779,966 use just one concave mirror.

Japanese laid-open patent document 4-234722 and U.S. Pat. No. 4,779,966 disclose catadioptric optical projection systems comprising a concave mirror and a double-pass lens group. Incident light propagates through the double-pass lens group in a first direction, strikes the concave mirror, and then propagates, as reflected light, back through the double-pass lens group in a second direction opposite to the first direction. Because the double-pass lens groups of Japanese laid-open patent document 4-234722 and U.S. Pat. No. 4,779,966 use only concave lenses and thus have negative power, the light entering the concave mirror is dispersed, requiring a relatively large-diameter concave mirror.

The double-pass lens group of Japanese laid-open patent document 4-234722 (1992) is completely symmetric, which reduces aberrations to an extreme degree, significantly reducing the aberration correction burden for the downstream refractive optical system. However, the completely symmetric configuration also reduces the distance between the intermediate image and the nearest optical element to such a degree that use of a beam-splitter is necessitated to effectively redirect the reflected light while allowing passage of the incident light.

The optical system disclosed in U.S. Pat. No. 4,779,966 comprises a concave mirror in a second imaging system that images an intermediate image onto the wafer. To provide adequate image brightness in this configuration, divergent light enters the concave mirror, requiring a relatively large-diameter mirror.

In optical systems utilizing several mirrors, it is possible to reduce the number of refractive lenses, but other problems arise.

In order to obtain adequate depth of focus with improved resolution, phase-shift reticles are often used. To most effectively use a phase-shift reticle, the ratio $\sigma$ between the NA of the illuminating optical system and the NA of the imaging optical system should be variable. An aperture stop can be installed in the imaging system to provide or increase this variability. But, in a catadioptric imaging system, as, for example, in U.S. Pat. No. 4,779,966, there is often no location for an effective aperture stop.

In catadioptric optical systems in which a double-pass lens system is employed in a demagnifying portion of the optical system, the demagnification reduces the allowable distance between the reflecting element and the wafer, so that few lenses can be placed in th optical path between the reflective element and the wafer. This necessarily limits the numerical aperture (NA), and thus the maximum brightness, of the optical system. Even if it were possible to realize an optical system with a high NA, many optical elements would have to be placed along a limited optical-path length, so that the distance between the wafer and the nearest surface of the objective lens (i.e., the working distance WD) would be undesirably short.

In conventional catadioptric optical systems, the optical path must be eccentric over at least a portion of its length. The adjustment procedure for the eccentric sections of such optical systems is difficult and makes the realization of precision systems essentially impossible.

The applicant has previously proposed a dual-imaging optical system which is designed with a first imaging system comprising a two-way optical system having a concave mirror and a double-pass lens group that allows light both incident to, and reflected from, the concave mirror to pass through the lens group. An intermediate image is formed by the first imaging system, and an image of the intermediate image is formed by a second imaging system. A reflecting surface is provided to direct the light flux from the first imaging system toward the second imaging system.

This dual-imaging optical system allows a smaller-diameter concave mirror, and provides an effective aperture-stop placement position, allowing a variable ratio $\sigma$, based on the NA of the illuminating optical system and the NA of the imaging system, for use with phase-shift reticles for resolution enhancement. It also allows for sufficient optical-system brightness and an optical system where the working distance WD, the distance between the wafer and the nearest surface of the object-imaging system (objective lens), can be relatively long. It also makes the adjustment of the eccentric section of the optical system easy, enabling the practical realization of a precision optical system.

While this dual-imaging optical system has many superior features, attempts to reduce the size of the optical system while maintaining image-forming performance result in increased distortion. That is, the optical system is not symmetric, so even if other aberrations are corrected, distortion will remain.

Also, when trying to correct distortion, astigmatism correction may be affected, and it is well known that it is extremely difficult to correct both types of aberration at the same time.

It is desirable to leave other types of well-corrected aberration as-is, and correct only the distortion or astigmatism aberration, especially the higher-order distortion.

In the manufacturing of high-precision optical systems, variance from product to product inevitably arises due to manufacturing tolerances. This variance results in different aberration levels for each optical system produced. Such manufacturing-error-induced aberrations are normally corrected by adjusting sections of the optical system. However, when there is asymmetric aberration of differing amounts across the image surface due to manufacturing tolerances, or when the generated aberration amounts are too great, it is often impossible to fully correct the system for manufacturing tolerances solely by adjusting sections of the optical system. In this case, corrections can sometimes be made by inserting an aspheric, aberration-correcting plate near the final focused image. While such a correcting plate is effective in correcting "angle-of-view" aberrations (such as distortion and/or astigmatism) when placed as close as possible to the image surface, in practice, the presence of other adjusting devices or measuring equipment near the image surface normally requires that such plates be placed a sufficient distance away from the image surface such that other types of aberration (related to aperture) are also affected. This complicates the correction process.

SUMMARY OF THE INVENTION

This invention provides a dual-imaging optical system that can effectively correct distortion to a high degree while providing a compact optical system, maintaining imaging performance, and correcting for manufacturing tolerances.

The invention comprises a dual-imaging optical system including a first imaging system that forms an intermediate image, and a second imaging system that forms an image of the intermediate image.

A reflecting surface directs light flux from the first imaging system to the second imaging system in this dual-imaging optical system.

A correcting optical system for correcting distortion, astigmatism, and/or accumulated manufacturing tolerances is placed at or near the intermediate image. The correcting optical system includes at least one aspheric surface. The aspheric optical surface may be a lens surface of a lens near the reflecting surface, or the reflecting surface itself may be made aspheric.

The shape of the aspheric optical surface can be axially symmetric. Alternatively, the aspheric optical surface can be a circular or non-circular cylindrical surface. Further alternatively, the surface can be completely asymmetric. Using the symmetric configuration, at least distortion, spherical aberration of the pupil, and accumulated manufacturing tolerances of the optical system can be corrected.

In order to correct distortion or astigmatism, correct accumulated manufacturing tolerances, and not create other types of distortion, a correcting optical system in the form of at least one aspheric optical surface is placed near the intermediate image. The placement of an aspheric correcting optical system near the intermediate image is especially effective for correcting higher-order distortion or astigmatism. A lens with an aspheric surface may be used for this purpose. On the other hand, since the reflecting surface is near the intermediate image, the reflecting surface itself may be made aspheric and used as the correcting optical system. The reflecting surface can be placed very close to or even at the intermediate image, so that making the reflecting-surface aspheric allows designation of the desired distortion or astigmatic-aberration correction in a straightforward manner, with little effect on other types of aberration.

The aspheric surface is preferably axially symmetric. Alternatively, an aspheric lens surface could be combined with a rectangular reflecting surface shaped so that change occurs only longitudinally in the reflecting surface. For the same sort of effect, the aspheric lens surface can be a circular or non-circular cylindrical (toric) surface. In other words, the effect that the shape of the aspheric surface has on distortion would be primarily dependent upon changes in the longitudinal inclination of the aspheric surface, and changes in the inclination in the shorter direction would not change the image height significantly, so it would not have that great an effect on distortion. A completely asymmetric aspheric surface may also be used as a lens surface or a reflecting surface.

From the point of view of machining the aspheric surface, simplicity is preferred, such that an axially symmetric surface or one which can change in a longitudinal direction only (a circular or non-circular cylindrical surface) would be better.

An axially symmetric aspheric surface may be produced by performing machining of a surface symmetrically around the optical axis. A circular or non-circular cylindrical surface may be reproduced with a single-direction aspheric-surface-machining device.

When there are different levels of aberration across the image surface due to manufacturing error, a completely asymmetric aberration-correction surface can be used, depending upon the amount of aberration. Naturally, the surface would be placed close to the intermediate image, so that just the corrections pertaining to the angle of view could be prioritized as necessary.

The above-summarized invention allows near-perfect correction of the particular aberrations which increase with reductions in the size of the optical system, and even near-perfect correction of hard-to-correct higher-order aberration and distortion and aberration due to manufacturing, while avoiding almost all effects on other aberrations, such as spherical aberration, coma aberration, sine conditions, and axial chromatic aberration.

The foregoing and other objects, features, and advantages of the invention will become more apparent from the following detailed description of example embodiments which proceeds with reference to the accompanying drawings.

BRIEF DESCRIPTION OF DRAWINGS

FIGS. 1(*a*)–1(*c*) are a schematic diagram of a first representative embodiment of the catadioptric reduction optical system of the present invention. FIGS. 1(a) and 1(b) are plan views, respectively, of the reticle and wafer of FIG. 1(c).

FIGS. 2(a)–2(c) are a schematic diagram of a second representative embodiment of the catadioptric reduction optical system of the present invention.

DETAILED DESCRIPTION

Figures 1A, 1C:
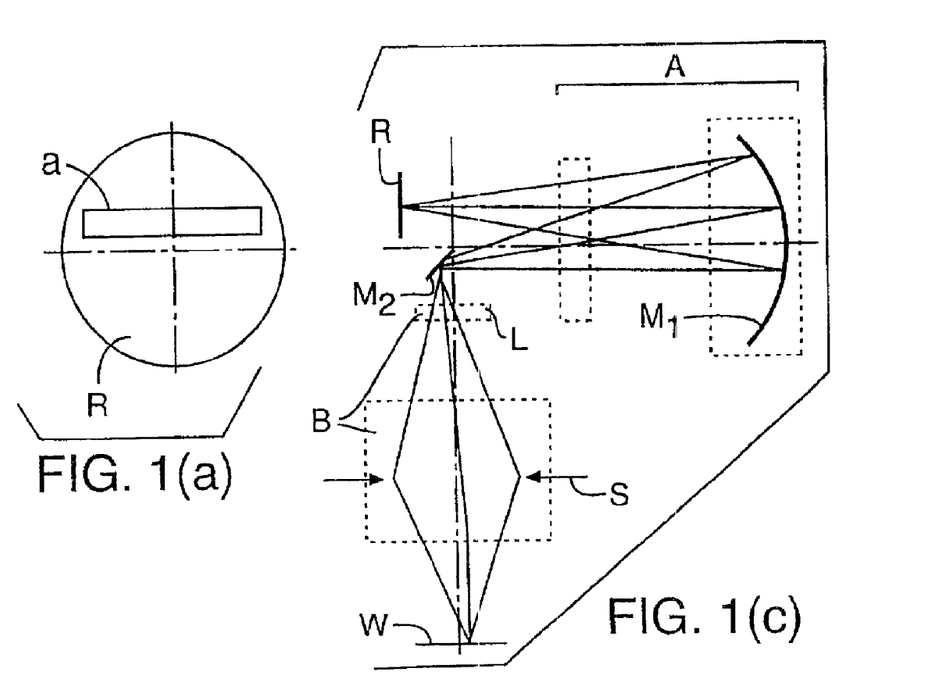
Figure 1B:
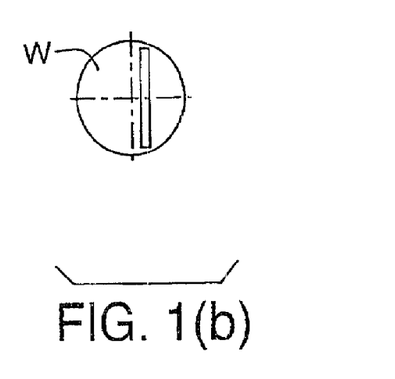

FIGS. 1(a)–1(c) show a first representative embodiment of the invention employed in a projection-optical system wherein a circuit pattern on a reticle R is reduced and transferred onto a semiconductor wafer W. This projection-optical system has a first imaging system A that forms an intermediate image of the pattern defined by the reticle R, a reflecting surface $M_2$ placed close to the intermediate image, and a second imaging system B that forms an image of the intermediate image on the wafer W.

Figure 3:
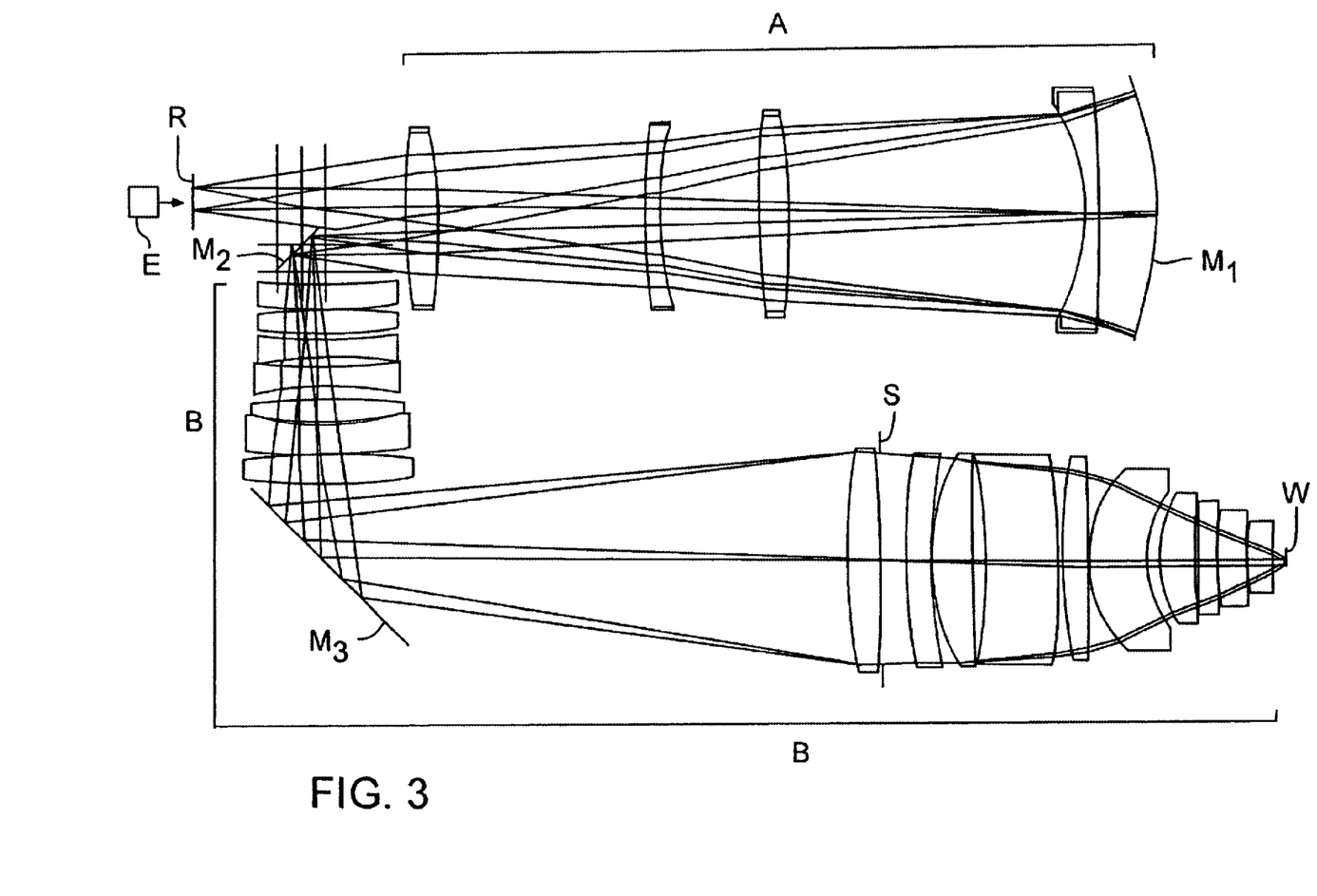
FIG. 3 is an optical diagram of the catadioptric reduction optical system of Example Embodiment 1, employing in the imaging system B a lens element L having an aspheric surface.
Figure 4:
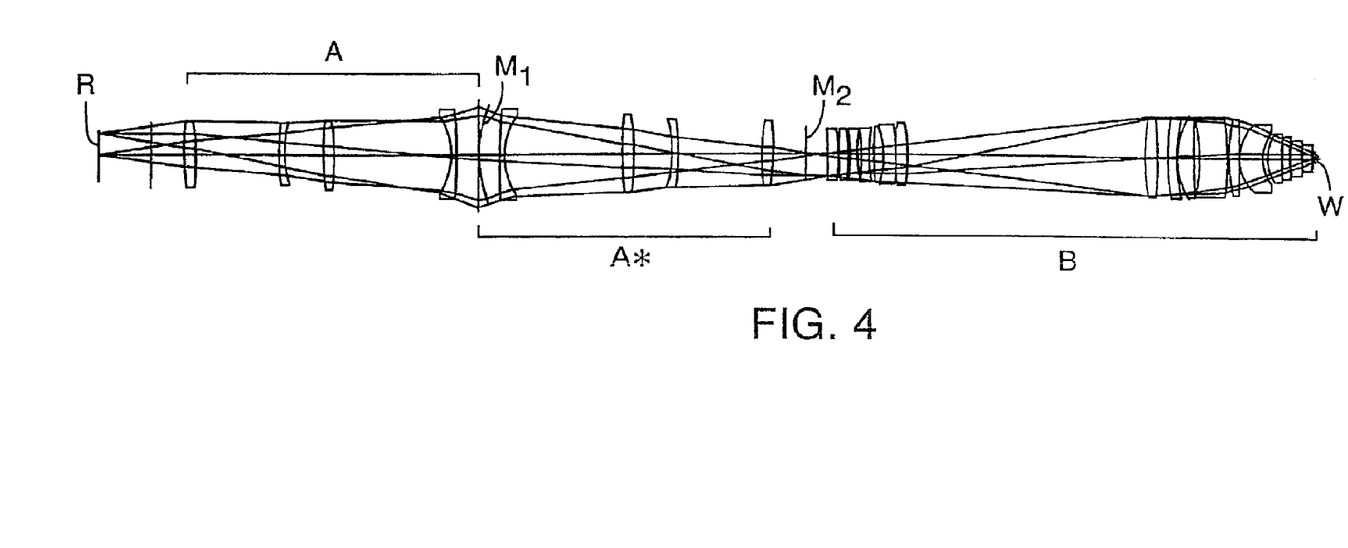
FIG. 4 is an expanded optical-path diagram of Example Embodiment 1.
Figure 6:
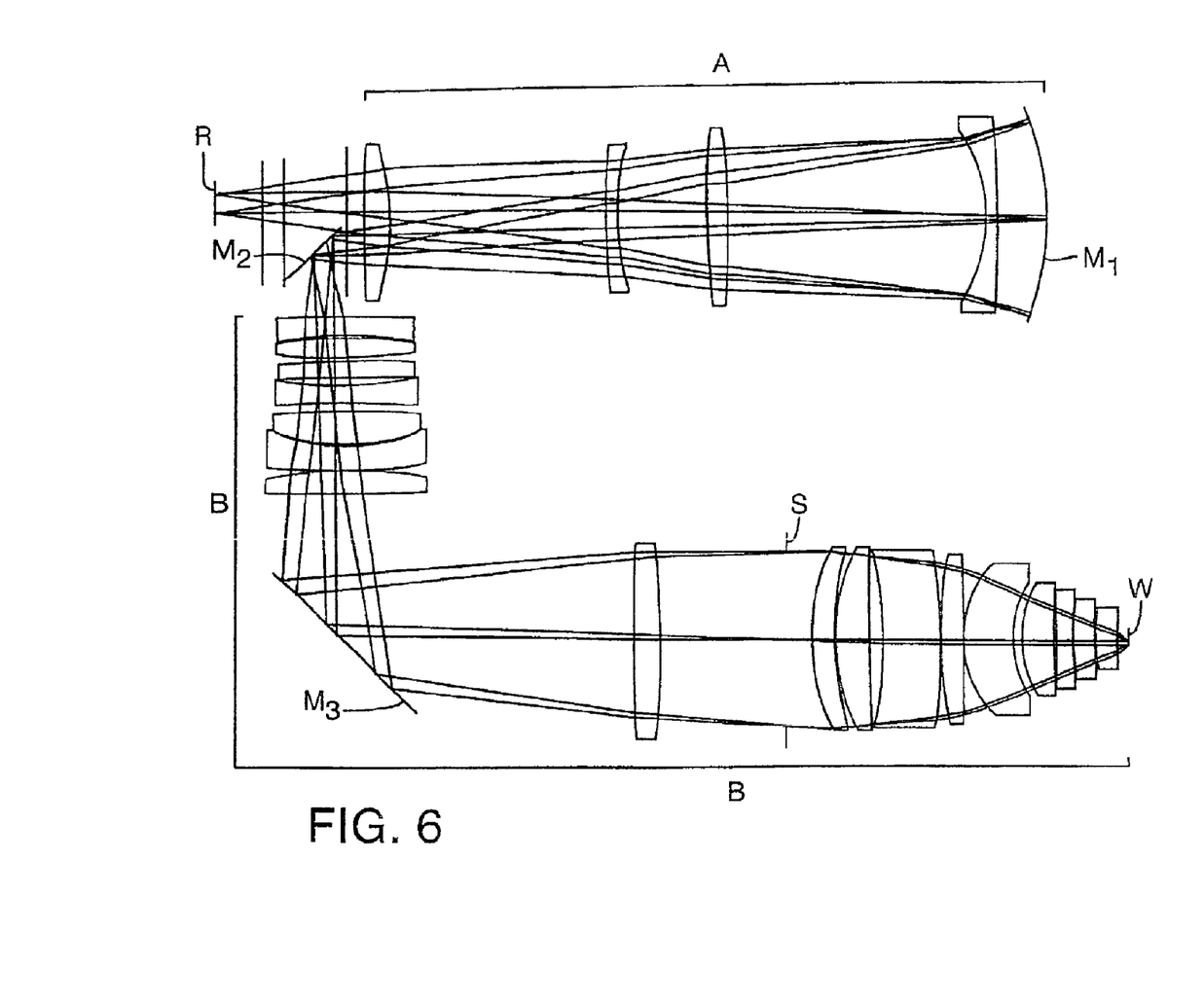
FIG. 6 is an optical diagram of the catadioptric reduction optical system of Example Embodiment 2, in which the reflecting surface $M_2$ is aspheric.

In the Example Embodiments described below, as seen in FIGS. 3, 4, and 6, the first imaging system A preferably comprises four refractive lenses and one concave mirror $M_1$. Light from the reticle R passes through the first imaging system A in both directions. The reflecting surface $M_2$ is placed to direct the light returning from the first imaging system A into the second imaging system B. This reflecting surface $M_2$ may be aspheric.

In the Example Embodiments described below, the second imaging system B preferably comprises 17 refractive lenses. An aperture stop S is placed inside the second imaging system B. Of the lens surfaces in the second imaging system B, the surface closest to the reflecting surface $M_2$ may be aspheric as an alternative to, or in addition to, the reflecting surface $M_2$ being aspheric.

By way of example, the projection-optical system of FIGS. 1(a)–1(c) is a lens system with a magnification ratio of 1/4×, an image-side numerical aperture NA of 0.6, a maximum object height of 72 mm, and a rectangular aperture a. The rectangular aperture corresponds to a r angular illumination field, with a vertical length of 120 mm. The refractive lenses can be made of fused silica ($SiO_2$) or calcium fluorite ($CaF_2$). At the 193-nm wavelength from an ultraviolet excimer laser, the chromatic axial and magnification aberrations are corrected for wavelength widths of ±0.1 nm.

Figure 2A:
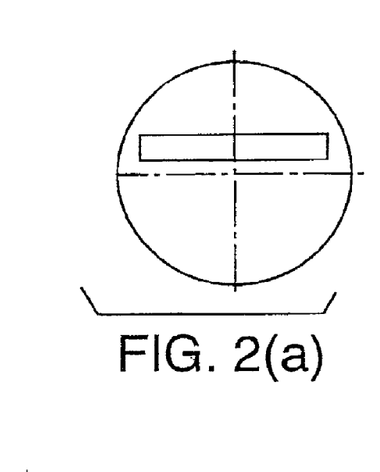
FIGS. 2(a) and 2(b) are plan views, respectively, of the reticle and wafer of FIG. 2(c).
Figure 2B:
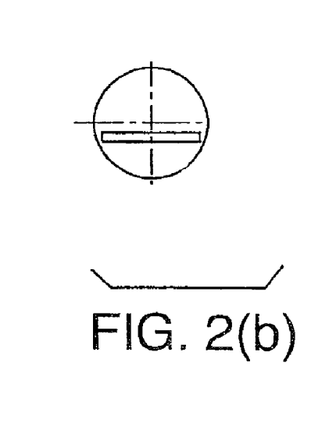
Figure 2C:
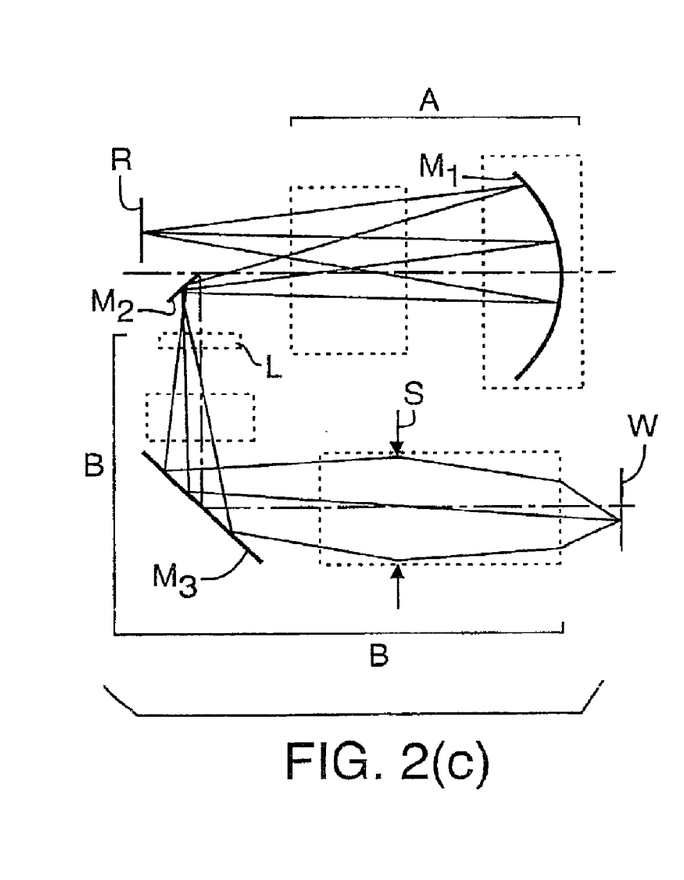

FIGS. 2(a)–2(c) show a schematic diagram of a second representative embodiment, in which a reflecting surface $M_3$ is placed inside the second imaging system B, and the direction of travel of the light illuminating the reticle R is aligned with the direction of travel of the light exposing the wafer W. Other aspects of this embodiment are the same as for the first embodiment, and as such, it the second embodiment has the same imaging performance as the first embodiment.

EXAMPLE EMBODIMENT 1

FIG. 3 shows an optical-path diagram of Example Embodiment 1 of a catadioptric optical system according to the present invention. As shown in FIG. 3, an excimer laser E is configured to illuminate the reticle R. The optical system of FIG. 3 can be used with the respective embodiment of FIGS. 1(a)–1(c) or of FIGS. 2(a)–2(c). In FIG. 3, the reflecting surface $M_2$ is planar, and the surface of lens element L in the optical system nearest to the reflecting surface $M_2$ is aspheric.

FIG. 4 shows an expanded optical-path diagram of Example Embodiment 1. That is, in order to avoid the complications of reflected light in the drawings, the light rays are shown in FIG. 4 as always propagating in the same direction.

Table 1 below lists the surface data of Example Embodiment 1. The optical path of FIG. 4 is set forth in Table 1 with the reflecting surface $M_3$ omitted and with a flat reflecting surface inserted, as surface 10, to represent the unfolding of the optical path as shown in FIG. 4. In Table 1, the first column lists the surface number from the reticle R; the second column, labeled "r", lists the radius of curvature for each of the surface; the third column, labeled "d", lists the axial distance from each surface to the adjacent surface; the fourth column lists the material for each lens; and the fifth column lists the group designation for each optical element. The lens surface featuring an asterisk (*) in the first column is aspheric. An asterisk in column 5 indicates a return path.

The shape of the aspheric surface in Example Embodiment 1 is represented by the following equation, $$S(y) = \frac{\frac{y^2}{r}}{1 + \sqrt{1 - \frac{Ky^2}{r^2}}} + \sum_{i=2}^{N} C_{2i} y^{2i}$$

wherein y is the height perpendicular to the optical axis, S(y) is the amount of sag parallel to the optical axis at height y, r is the radius of curvature on the optical axis, κ is the conic coefficient, and $C_n$ is the nth aspheric surface coefficient. The conic coefficient κ and the aspheric surface coefficients for Example Embodiment 1 are shown in Table 2 (entitled Example Embodiment 1 Aspheric Surface Data), below.

The refractive index n and the Abbe number v±0.1 nm of the standard wavelength in relation to the standard wavelength used for fused silica ($SiO_2$) and calcium fluoride ($CaF_2$) are as follows.

$SiO_2$:n=1.56019v=1780

$CaF_2$:n=1.50138v=2550

Figure 5A:
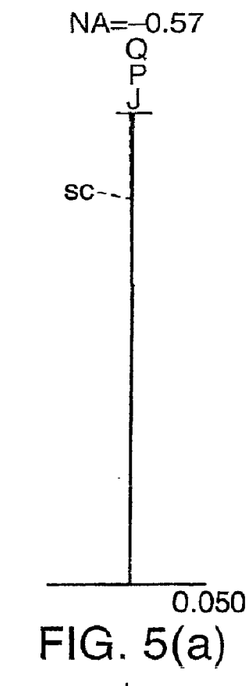
FIGS. 5(a), 5(b), 5(c), 5(d), and 5(e) are, respectively, graphical representations of spherical aberration, astigmatic aberration, distortion, coma, and (chromatic) magnification aberration exhibited by Example Embodiment 1.
Figure 5B:
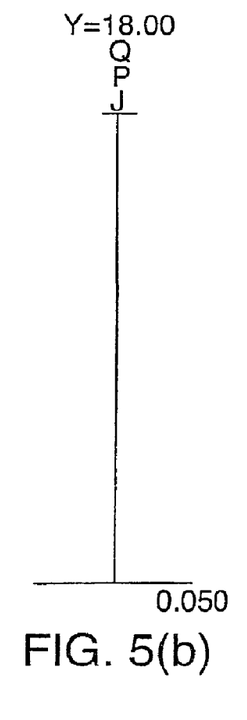
Figure 5C:
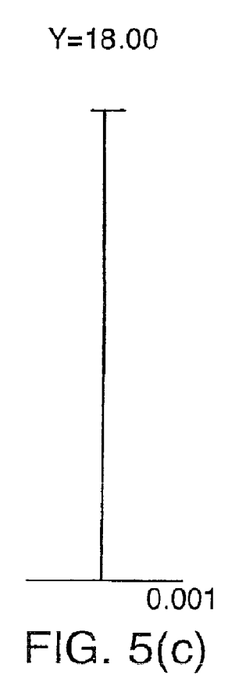
Figure 5D:
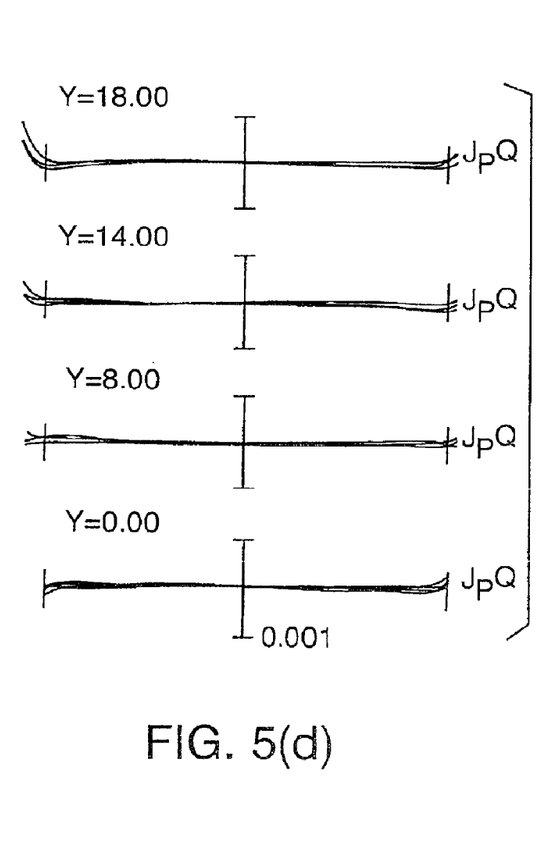
Figure 5E:
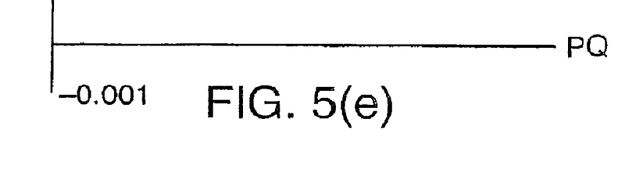

FIGS. 5(a), 5(b), 5(c), 5(d), and 5(e) depict representative plots of spherical aberration, astigmatic aberration, distortion, coma, and magnification aberration exhibited by Example Embodiment 1. In FIG. 5(a), SC represents deviation from the sine condition. Also, in each of FIGS. 5(a)–5(d), Y is the image height, P is the standard wavelength +0.1 nm, J is the standard wavelength, and Q is the standard wavelength −0.1 nm. As is clear from each of FIGS.

5(a)–5(e), spherical aberration, coma, astigmatism, and distortion are all corrected to a very high degree, demonstrating the superior performance of this optic system.

Note that, in this example embodiment, a lens having an aspheric surface was placed immediately after the reflecting surface $M_2$. Alternatively, an aspheric lens surface can be placed immediately in front of the reflecting surface $M_2$. In Table 1, surfaces 1 and 10 are virtual reflecting surfaces.

TABLE 1

Example Embodiment 1 Surface Data

| No. | r | d | Material | Group |
|---|---|---|---|---|
| 0 | — | 160.00000 | | reticle |
| 1 | ∞ | 98.99633 | | |
| 2 | 1140.26480 | 40.00000 | $CaF_2$ | A |
| 3 | −579.11541 | 255.01123 | | |
| 4 | 1182.85550 | 15.00000 | $SiO_2$ | A |
| 5 | 409.99148 | 124.15981 | | |
| 6 | 1269.25390 | 30.00000 | $SiO_2$ | A |
| 7 | −1392.04400 | 366.83229 | | |
| 8 | −269.86608 | 15.00000 | $SiO_2$ | A |
| 9 | −2727.50700 | 70.00000 | | |
| 10 | ∞ | 0 | | |
| 11 | 443.32063 | 70.00000 | | A ($M_1$) (Concave Mirror) |
| 12 | 2727.50730 | 15.00000 | $SiO_2$ | A* |
| 13 | 269.86608 | 366.83229 | | |
| 14 | 1392.04380 | 30.00000 | $SiO_2$ | A* |
| 15 | −1269.25400 | 124.15981 | | |
| 16 | −409.99148 | 15.00000 | $SiO_2$ | A* |
| 17 | −1182.85600 | 255.01123 | | |
| 18 | 579.11541 | 40.00000 | $CaF_2$ | A* |
| 19 | −1140.26500 | 98.99633 | | |
| 20 | ∞ | 73.73678 | | $M_2$ (Reflecting Surface) |
| *21 | −1617.55100 | 30.00000 | $SiO_2$ | B |
| 22 | −946.74609 | 0.10000 | | |
| 23 | 443.20483 | 30.00000 | $CaF_2$ | B |
| 24 | −613.15563 | 5.00000 | | |
| 25 | −1133.72600 | 24.00000 | $SiO_2$ | B |
| 26 | 624.49548 | 10.94895 | | |
| 27 | −718.16831 | 24.00000 | $SiO_2$ | B |
| 28 | 413.72496 | 14.47012 | | |
| 29 | 568.99448 | 30.00000 | $CaF_2$ | B |
| 30 | −356.83594 | 2.54622 | | |
| 31 | −303.66460 | 35.00000 | $SiO_2$ | B |
| 32 | −748.52031 | 0.10000 | | |
| 33 | 1067.17910 | 35.00000 | $CaF_2$ | B |
| 34 | −916.15492 | 732.19624 | | |
| 35 | 639.63609 | 40.00000 | $SiO_2$ | B |
| 36 | −1837.83000 | 1.00000 | | |
| 37 | — | 32.10226 | | B (Aperture Stop) |
| 38 | 851.14867 | 30.00000 | $SiO_2$ | B |
| 39 | 596.88123 | 1.26000 | | |
| 40 | 256.43786 | 50.00000 | $CaF_2$ | B |
| 41 | 4113.75620 | 18.94853 | | |
| 42 | −477.89543 | 88.37165 | $SiO_2$ | B |
| 43 | −606.10781 | 0.51272 | | |
| 44 | 690.95035 | 32.52509 | $CaF_2$ | B |
| 45 | −3442.72000 | 0.36748 | | |
| 46 | 153.43477 | 69.82314 | $SiO_2$ | B |
| 47 | 132.23252 | 14.68969 | | |
| 48 | 145.32257 | 45.19542 | $SiO_2$ | B |
| 49 | 1541.26430 | 4.20000 | | |
| 50 | −1123.78400 | 22.68000 | $SiO_2$ | B |
| 51 | 1762.68930 | 1.91993 | | |
| 52 | 685.77175 | 31.14230 | $SiO_2$ | B |
| 53 | 958.60472 | 2.25212 | | |
| 54 | 399.11389 | 31.27391 | $SiO_2$ | B |
| 55 | 5403.63050 | 15.00000 | | Wafer |

TABLE 2

Example Embodiment 1 Aspheric Surface Data

Lens Surface Number: 21       K = 1.0000
$C_4 = -2.38900 \times 10^{-9}$       $C_6 = -4.71130 \times 10^{-15}$
$C_8 = -2.05220 \times 10^{-19}$       $C_{10} = 8.36490 \times 10^{-24}$

EXAMPLE EMBODIMENT 2

FIG. 6 shows an optical path diagram of Example Embodiment 2 of a catadioptric optical system according to the present invention. The optical system of FIG. 3 can be used with the respective embodiment of FIGS. 1(a)–1(c) or of FIGS. 2(a)–2(c). In FIG. 3, the reflecting surface $M_2$ is aspheric, and the optical surface of lens L in the optical system B nearest to the reflecting surface $M_2$ is spherical.

Table 3 below lists the surface data of Example Embodiment 2. An optical path corresponding to FIG. 1 is set forth in Table 3, with the mirror $M_3$ omitted. As in Table 1, in Table 3, the first column lists the surface number from the reticle R; the second column, labeled "r", lists the radius of curvature for each of the surface; the third column, labeled "d", lists the axial distance from each surface to the next surface; the fourth column list the material for each lens; and the fifth column lists the group designation for each optical element. The surface featuring an asterisk (*) in the first column is aspheric. An asterisk in column 5 indicates a return path. In contrast with Table 1, negative distances (rather than negative radii of curvature) are employed in Table 3 to represent the return path of reflected light. In Table 3, surfaces 1–6, 13, and 26–31 are virtual surfaces that were considered as part oft lens-design process.

The shape of the aspheric surface of Example Embodiment 2 may be represented by the equation presented above relative to Example Embodiment 1. The conic coefficient κ and the aspheric surface coefficients for Example Embodiment 2 are shown in Table 4 (entitled Example Embodiment 2 Aspheric Surface Data), below.

Figure 7:
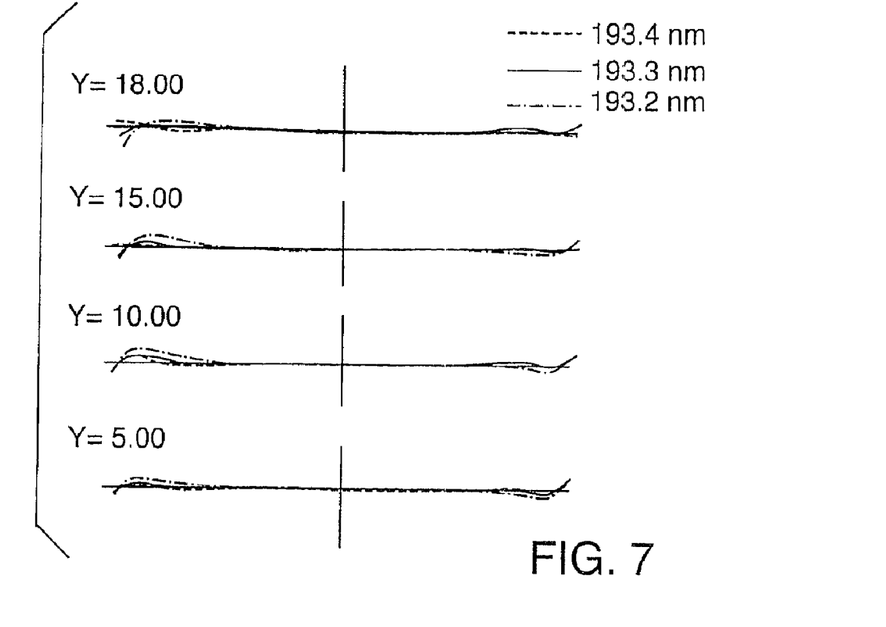
FIG. 7 is a graphical representation of the transverse aberration exhibited by Example Embodiment 2.
Figure 8:
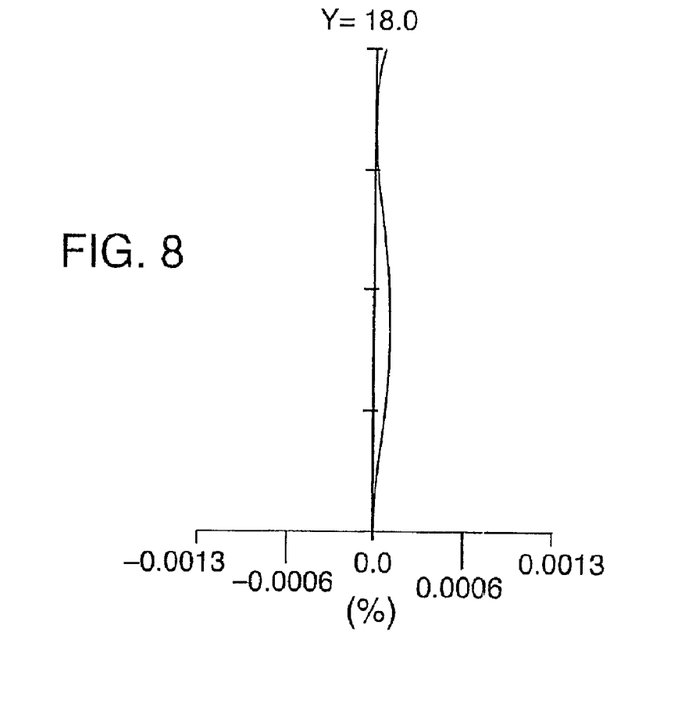
FIG. 8 is a graphical representation of the distortion exhibited by Example Embodiment 2.

FIG. 7 depicts representative plots of coma exhibited by Example Embodiment 2. In each of the diagrams, Y is the image height. AS is clear from these aberration diagrams, the optical system of Example Embodiment 2 provides excellent performance, particularly in that coma is corrected nearly to the point of no aberration. FIG. 8 provides plots of distortion exhibited by Example Embodiment 2. As is clear from the distortion curve, distortion correction is extremely good.

TABLE 3

Example Embodiment 2 Surface Data

| No. | r | d | Material | Group |
|---|---|---|---|---|
| 0 | — | 60.000000 | | reticle |
| 1 | ∞ | 0 | | |
| 2 | ∞ | 30.000000 | | |
| 3 | ∞ | 0 | | |
| 4 | ∞ | 80.000000 | | |
| 5 | ∞ | 0 | | |
| 6 | ∞ | 21.110201 | | |
| 7 | 1363.11994 | 36.000000 | $CaF_2$ | A |
| 8 | −404.99434 | 279.630076 | | |
| 9 | 1408.93350 | 13.500000 | $SiO_2$ | A |
| 10 | 376.65770 | 116.466055 | | |
| 11 | 906.81981 | 27.000000 | $SiO_2$ | A |
| 12 | −1332.26491 | 154.962803 | | |

TABLE 3-continued

Example Embodiment 2 Surface Data

| No. | r | d | Material | Group |
|---|---|---|---|---|
| 13 | ∞ | 175.635036 | | |
| 14 | −249.08892 | 13.500000 | SiO$_2$ | A |
| 15 | −3128.27181 | 63.000000 | | |
| 16 | −401.41197 | −63.000000 | | A (M$_1$) (Concave Mirror) |
| 17 | −3128.27181 | −13.500000 | SiO$_2$ | A* |
| 18 | −249.08892 | −175.635036 | | |
| 19 | ∞ | −154.962803 | | |
| 20 | −1332.26491 | −27.000000 | SiO$_2$ | A* |
| 21 | 906.81981 | −116.466055 | | |
| 22 | 376.65770 | −13.500000 | SiO$_2$ | A* |
| 23 | 1408.93350 | −279.630076 | | |
| 24 | −404.99434 | −36.000000 | CaF$_2$ | A* |
| *25 | 1363.11994 | −21.110201 | | M$_2$ (Reflecting Surface) |
| 26 | ∞ | 0 | | |
| 27 | ∞ | 0 | | |
| 28 | ∞ | 0 | | |
| 29 | ∞ | 0 | | |
| 30 | ∞ | 0 | | |
| 31 | ∞ | 130.000000 | | |
| 32 | 2229.03311 | 24.000000 | SiO$_2$ | B |
| 33 | 408.22661 | 3.000000 | | |
| 34 | 569.14187 | 27.000000 | CaF$_2$ | B |
| 35 | −444.32289 | 4.500000 | | |
| 36 | 1784.92158 | 21.600000 | SiO$_2$ | B |
| 37 | −2577.16606 | 10.722977 | | |
| 38 | −343.44849 | 21.600000 | SiO$_2$ | B |
| 39 | 1202.96387 | 12.859591 | | |
| 40 | 1625.87851 | 47.000000 | CaF$_2$ | B |
| 41 | −195.20517 | 2.412834 | | |
| 42 | −193.18029 | 31.500000 | SiO$_2$ | B |
| 43 | −1287.21632 | 0.100000 | | |
| 44 | 730.56017 | 31.500000 | CaF$_2$ | B |
| 45 | −2127.69381 | 556.238917 | | |
| 46 | 2508.51186 | 36.000000 | SiO$_2$ | B |
| 47 | −1178.02445 | 162.012540 | | |
| 48 | — | 39.867585 | | (Aperture Stop) |
| 49 | 303.62383 | 27.000000 | SiO$_2$ | B |
| 50 | 440.67155 | 1.134000 | | |
| 51 | 249.11054 | 45.000000 | CaF$_2$ | B |
| 52 | 3674.25611 | 17.045914 | | |
| 53 | −543.69897 | 75.048590 | SiO$_2$ | B |
| 54 | −781.60219 | 0.461446 | | |
| 55 | 611.86734 | 29.284957 | CaF$_2$ | B |
| 56 | −4354.55637 | 0.330733 | | |
| 57 | 142.52792 | 62.831346 | SiO$_2$ | B |
| 58 | 128.33358 | 13.206846 | | |
| 59 | 142.57235 | 40.662754 | SiO$_2$ | B |
| 60 | 754.18207 | 3.780000 | | |
| 61 | −1327.11593 | 20.412000 | SiO$_2$ | B |
| 62 | 531.69413 | 1.727935 | | |
| 63 | 375.03771 | 28.020164 | SiO$_2$ | B |
| 64 | 779.50239 | 2.026905 | | |
| 65 | 283.45101 | 25.490979 | SiO$_2$ | B |
| 66 | 4863.26742 | 15.000000 | | Wafer |

TABLE 4

Example Embodiment 2 Aspheric Data

Surface Number: 25  K = 1.0000
$C_4 = -0.162401 \times 10^{-10}$  $C_6 = -0.117682 \times 10^{-15}$
$C_8 = -0.123567 \times 10^{-19}$  $C_{10} = 0.274232 \times 10^{-25}$ Having illustrated and demonstrated the principles of the invention in example embodiments, it should be apparent to those skilled in the art that the preferred embodiments can be modified in arrangement and detail without departing from such principles. I claim as the invention all that comes within the scope of the following claims.

What is claimed is:

1. An optical imaging system configured to form an image of an object, the optical imaging system comprising:
   a catadioptric optical system having an optical axis and a refractive optical system situated downstream of the catadioptric optical system along the optical axis;
   the catadioptric optical system being configured to form an intermediate image of a predetermined area of the object, wherein the predetermined area of the object and the intermediate image are displaced from the optical axis on first and second sides, respectively, of the optical axis in a manner by which light flux propagating to the catadioptric optical system from the object is separated from light flux propagating downstream of the catadioptric optical system to the refractive optical system;
   the refractive optical system being configured to form an image of the intermediate image, wherein the image formed by the refractive optical system is displaced from the optical axis; and
   at least one of the catadioptric optical system and the refractive optical system includes an aspheric optical surface.

2. The optical imaging system of claim 1, wherein an image-side numerical aperture (NA) of the optical imaging system is 0.6.

3. The optical imaging system of claim 1, wherein an image height on the surface is at least 10 mm.

4. The optical imaging system of claim 1, further comprising a reflective surface arranged to direct a light flux from the catadioptric optical system to the refractive optical system.

5. A projection-exposure method, comprising:
   illuminating a pattern; and
   imaging the pattern on a substrate with the optical imaging system of claim 4.

6. The optical imaging system of claim 1, wherein the refractive optical system includes an aperture stop.

7. A projection-exposure method, comprising:
   illuminating a pattern; and
   imaging the pattern on a substrate with the optical imaging system of claim 6.

8. The optical imaging system of claim 1, wherein the aspheric optical surface is a refractive optical surface.

9. The optical imaging system of claim 1, wherein the aspheric optical surface is a reflective optical surface.

10. An exposure apparatus comprising:
    a laser situated to illuminate a reticle;
    a substrate; and
    the optical imaging system of claim 1, situated and configured to form an image of the reticle on the substrate.

11. A projection-exposure method, comprising:
    illuminating a pattern; and
    imaging the pattern on a substrate with the optical imaging system of claim 10.

12. The optical imaging system of claim 1, wherein the aspheric surface is configured to compensate at least one of distortion, pupil spherical aberration, manufacturing error, and astigmatism.

13. The optical imaging system of claim 12, wherein the aspheric surface is axially symmetric.

14. The optical imaging system of claim 12, wherein the aspheric surface is axially asymmetric.

15. The optical imaging system of claim 1, herein the aspheric surface is axially symmetric.

16. The optical imaging system of claim 15, wherein the aspheric surface is configured to compensate at least one of distortion, pupil spherical aberration, and manufacturing error.

17. The optical imaging system of claim 1, wherein the aspheric surface is axially asymmetric.

18. The optical imaging system of claim 17, wherein the aspheric surface is configured to compensate at least one of astigmatism and manufacturing error.

19. The optical imaging system of claim 1, further comprising a first reflective surface situated to direct a light flux from the catadioptric optical system to the refractive optical system.

20. The optical imaging system of claim 17, further comprising a second reflective surface, wherein the refractive optical system comprises a first lens group and a second lens group, and the second reflective surface is situated between the first lens group and the second lens group.

21. The optical imaging system of claim 1, wherein the catadioptric optical system comprises a concave mirror and at least one diverging lens situated so that optical radiation from the object is directed through the diverging lens to the concave mirror, and directed from the concave mirror to the diverging lens.

22. The optical imaging system of claim 21, wherein the catadioptric optical system comprises at least four lens elements.

23. A projection-exposure method, comprising:
   illuminating a pattern; and
   imaging the pattern on a substrate with the optical imaging system of claim 1.

24. An optical imaging system for forming, on a surface, an image of a predetermined area of an object, the imaging system comprising:
   a catadioptric optical system having an optical axis;
   a refractive optical system situated downstream of the catadioptric optical system along the optical axis;
   the catadioptric optical system comprising a concave mirror and at least one diverging lens, the catadioptric optical system receiving a light flux, from the area of the object located on a first side of the optical axis, and forming from the light flux an intermediate image of the area on a second side of the optical axis, thereby separating the light flux from the area from the light flux reflected from the concave mirror, the diverging lens being arranged such that the light flux from the area of the object propagates through the diverging lens to the concave mirror and the light flux reflected from the concave mirror propagates through the diverging lens downstream to the refractive optical system;
   the refractive optical system being configured to form on the surface an image of the intermediate image, the image being displaced from the optical axis; and
   at least one of the catadioptric optical system and the refractive optical system including an aspheric optical surface.

25. The optical imaging system of claim 24, wherein an image-side numerical aperture of the imaging system is 0.6.

26. A projection-exposure method, comprising:
   illuminating a pattern; and
   imaging the pattern on a substrate with the optical imaging system of claim 25.

27. The optical imaging system of claim 24, wherein an image height on the surface is at least 10 mm.

28. The optical imaging system of claim 24, further comprising a reflective surface arranged to direct a light flux from the catadioptric optical system to the refractive optical system.

29. A projection-exposure method, comprising:
   illuminating a pattern; and
   imaging the pattern on a substrate with the optical imaging system of claim 28.

30. The optical imaging system of claim 24, wherein the refractive optical system includes an aperture stop.

31. The optical imaging system of claim 24, wherein the aspheric optical surface is a refractive optical surface.

32. The optical imaging system of claim 24, wherein the aspheric optical surface is a reflective optical surface.

33. An exposure apparatus comprising:
   a laser configured to direct an ultraviolet flux to a reticle;
   a substrate; and
   the imaging system recited in claim 24, situated and configured to form an image of the reticle on the substrate.

34. The optical imaging system of claim 24, wherein the aspheric surface is configured to compensate a high order aberration.

35. The optical imaging system of claim 34, wherein the aspheric surface is configured to compensate at least one of distortion and astigmatism.

36. An optical system configured to form on a surface an image of a predetermined area of an object, the optical system comprising:
   a catadioptric optical system situated, on an optical axis of the optical system, between the object and a point that is optically conjugate to the object, wherein a light flux propagating from the predetermined area on one side of the optical axis is separated by the catadioptric optical system from a light flux propagating downstream of the catadioptric optical system on a second side of the optical axis; and
   a refractive optical system situated on the optical axis between the catadioptric optical system and the surface, the refractive optical system being configured to form an image of the predetermined area of the object on the surface at a location on the surface that is displaced from the optical axis, wherein at least one of the catadioptric optical system and the refractive optical system includes an aspheric surface.

* * * * *

UNITED STATES PATENT AND TRADEMARK OFFICE
CERTIFICATE OF CORRECTION

PATENT NO. : 6,867,931 B2
DATED : March 15, 2005
INVENTOR(S) : Tomowaki Takahashi It is certified that error appears in the above-identified patent and that said Letters Patent is hereby corrected as shown below:

Column 2,
Line 41, "in th optical" should be -- in the optical --.

Column 5,
Line 57, "to a r angular" should be -- to a rectangular --.

Column 6,
Line 3, "it the second" should be -- the second --.

Column 8,
Line 34, "oft" should be -- of the --.
Line 44, "AS is clear" should be -- As is clear --.

Column 11,
Line 1, ", herein" should be -- , wherein --.
Line 16, "claim 17," should be -- claim 19, --.

Signed and Sealed this

Fifteenth Day of November, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,867,931 B2 |
| APPLICATION NO. | : 10/086472 |
| DATED | : March 15, 2005 |
| INVENTOR(S) | : Tomowaki Takahashi |

It is certified that error appears in the above-identified patent and that said Letters Patent is hereby corrected as shown below:

On the Cover Item (63) (Related U.S. Application Data):

Page 1, columns 63-64, "Continuation of application No. 09/679,268, filed on October 4, 2000, now Pat. No. 6,454,385" should read --Continuation of application No. 09/679,267, filed October 4, 2000, now Pat. No. 6,392,822.--

Signed and Sealed this

First Day of May, 2007

JON W. DUDAS
*Director of the United States Patent and Trademark Office*